United States Patent [19]

Bolinger et al.

[11] Patent Number: 5,779,496

[45] Date of Patent: Jul. 14, 1998

[54] SLIDING CONNECTOR BLOCK SYSTEM FOR ELECTRONIC DEVICES

[75] Inventors: Nancy J. Bolinger, Chapel Hill, N.C.; Gary Bethurum, Laguna Niguel, Calif.; David Campbell Brower, Wake Forest, N.C.; Kenneth Wayne Maynor; Charles Lee Smith, both of Durham, N.C.

[73] Assignee: International Business Machines Corporation, Armonk, N.Y.

[21] Appl. No.: 728,725

[22] Filed: Oct. 11, 1996

[51] Int. Cl.[6] .................................................. H01R 13/629
[52] U.S. Cl. .................................... 439/377; 439/492
[58] Field of Search ............................. 439/377, 248, 439/492, 157, 64, 77, 928

[56] References Cited

U.S. PATENT DOCUMENTS

| | | | |
|---|---|---|---|
| 4,417,779 | 11/1983 | Wilson | 339/75 MP |
| 4,477,137 | 10/1984 | Ayer | 339/59 M |
| 4,499,523 | 2/1985 | Gillett et al. | 361/383 |
| 5,010,446 | 4/1991 | Scannell | 361/398 |
| 5,227,953 | 7/1993 | Lindberg et al. | 361/393 |
| 5,299,944 | 4/1994 | Larabell et al. | 439/157 |
| 5,325,263 | 6/1994 | Singer et al. | 439/248 |
| 5,386,344 | 1/1995 | Beaman et al. | 361/785 |
| 5,427,534 | 6/1995 | Spickler et al. | 439/64 |
| 5,469,332 | 11/1995 | Alvite | 361/737 |

Primary Examiner—Khiem Nguyen
Assistant Examiner—Eugene G. Byrd
Attorney, Agent, or Firm—John J. Timar

[57] ABSTRACT

A sliding connector block system for inserting an electronic device, such as a wireless modem transceiver, housed in a sliding metal tray into an electrical equipment enclosure containing other electronic components and blindly interconnecting the electronic device with another component via a flexible cable secured within a sliding connector block. The metal tray and connector block have flanges that align with a pair of guide rails mounted in the equipment enclosure and allow travel of the tray and connector block along the rails between stops. A bezel bonded to the front of the tray provides a handle for inserting and removing the electronic device. A grounding clip is also provided to ground the flexible cable to the sliding metal tray and rails.

21 Claims, 10 Drawing Sheets

SLIDING CONNECTOR BLOCK SYSTEM FOR ELECTRONIC DEVICES

BACKGROUND OF THE INVENTION

1. Field of the Invention

This invention relates in general to externally attachable peripheral devices for portable computer systems such as laptop or notebook computers, and in particular to a sliding connector block system for electronic devices for cellular networks for voice and data communication that provide a durable, mechanically reliable means for blindly interconnecting electronic devices to a flexible circuit cable assembly, while allowing an interconnected electronic device and flexible cable to slide between stops for optimal electrical performance.

2. Prior Art

The Personal Computer Memory Card International Association (PCMCIA) is a technical standards setting group and trade association that sets standards for PC cards to ensure interoperability between PC cards of different manufacturers. PCMCIA has set forth standards, dimensions and mechanical tolerances for memory cards and connectors for three different sizes of cards known respectively as Type I (3.3 mm thick), Type II (5.0 mm thick) and Type III (10.5 mm thick) PC cards. Connectors and guide rails are standardized in all types. One of the constraints of mechanical package designs for PC peripheral card assemblies is that the design has a form factor meeting the requirements for products specified under the PCMCIA standard.

An electronic device to which this present invention is particularly relevant is a wireless modem. A wireless modem device enables a portable computer system to communicate with other computer systems without requiring physical access to land line communication ports. A wireless modem can be installed as a PC adapter card or in a PCMCIA adapter slot. The wireless modem typically consists of both a radio portion and a baseband portion.

The transmitter in the radio portion generates RF signals using a baseband signal to modulate the carrier signal. The receiver in the radio portion produces a baseband signal from the received RF signals by demodulating the RF signals. An antenna is used for transmitting and receiving the RF communication signals. The baseband portion provides a baseband signal to the transmitter and accepts baseband signals from the receiver.

In a prior art implementation of a wireless modem device for a portable computer system, the packet radio was housed in a sliding, metal tray within a cartridge.

Figure 1:
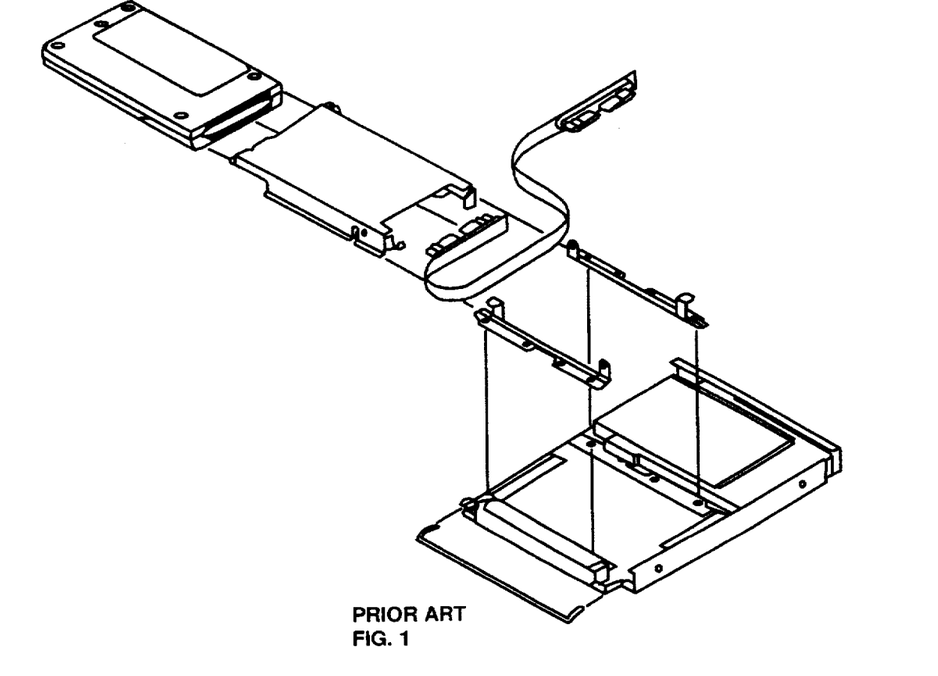
FIG. 1 shows an exploded bottom isometric view of the components of a prior art implementation of a sliding metal tray system.

As shown in FIG. 1, the cartridge housed the metal tray, packet radio, Type II PC base card adapter and a flexible circuit cable. The radio was assembled in a sliding, metal tray fabricated from American Iron and Steel Institute (AISI) 304, ¾ hardness temper, stainless steel. The prior art tray design incorporated an electromagnetic compatibility (EMC) clip feature for grounding the flexible cable to the tray. The flexible cable was connected to the radio connector and clipped to the back of the tray in manufacturing. The cable was routed around the back of the radio behind two posts in the left rail to connect to the front of the Type II PC Base card adapter, forming S-shaped bends that provided slack to allow the tray to slide in and out without disconnecting the cable. The radio/tray/flexible cable assembly slid partially out of the left side of a notebook computer bay to a stop. The intent was that the flexible cable would always remain connected. The purpose of partially sliding the radio out was to: (1) optimize the electrical antenna performance (i.e., reduce electromagnetic interference), (2) provide access to the telephone headset jack at the side of the radio, and (3) move the antenna away from the computer user's left hand. The metal tray/radio travelled back and forth in guide rails. Two vertical posts in each rail acted as stops for the tray thereby limiting travel.

In the prior art device, a small, detachable, quarter wave, monopole antenna ranging from approximately 1.5" to 3" long was mounted on the RF coaxial radio connector. The small, rotating antenna mounted on a non-industry-standard, right-angle, microminiature, RF coaxial, printed circuit board mounted, electrical connector having a height less than 5 mm above the printed circuit board. Because of the antenna's small size, the electrical performance and appearance were not satisfactory. Over time, the antenna became loose, rotating too freely, not staying in place.

Antenna rotation subjected the radio connector solder joints to excessive fatigue stress causing the connector to physically break and shear off the board and fail by cracks in the thin wall section of the connector barrel. A masking material sprayed onto the board in the printed circuit card manufacturing process prevented solder from flowing completely to the pads around the five pin through holes for the connector preventing an adequate solder connection. Connectors with brass plating instead of beryllium copper plating decrease the load limit by a factor of approximately 2.5 to 3.0. The fact that the radio connector was non-industry-standard limited the choices of commercially available mating antenna connectors. The radio connector cantilevered and protruded off the end of the circuit card, increasing vulnerability to damage and stress. The choice of a detachable antenna and repeated connector insertions stressed both the radio and antenna connectors.

The flexible cable was subject to physical damage each time the tray was moved forward and backward, and was not reliably held in place. The flexible cable was also subject to excessive bend stressing and wear. The flexible cable was abraded by the rear post on the right rail, and a screw protruding inside the cartridge each time the tray was slid in and out. Cyclic testing resulted in failure.

To use the device, one had to put his/her fingers inside the computer notebook's option bay, grab a small wire handle on the tray, and pull the tray assembly out through the 15 mm high computer option bay opening to its operating position. Reaching inside the computer was undesirable, and most users could not fit their fingers inside the small opening.

The sliding, metal tray had too much lateral and vertical play. The metal tray had sharp edges and was fabricated from a ¾ hardness temper, brittle stainless steel that easily fractured leaving sharp edges. A costly, black, conductive paint did not adhere or wear well with the flakes from the paint damaging electronic circuitry.

There was no bottom cover to protect or conceal the exposed electronics. This left the fragile, flexible cable and circuit card vulnerable to damage, dirt and dust, and gave the product an unfinished appearance. Without a cover, the flexible cable could easily dislodge and fall partially out.

The radio did not conform to industry standard PC card dimensions, the molded plastic housing dimensions varying between manufacturing batches, ruling out the use of industry standard PC card guide rails.

SUMMARY OF THE INVENTION

It is, therefore, an object of this invention to provide a sliding connector block system to blindly connect removable electronic devices to flexible circuit cable assemblies allowing the interconnected electronic device and flexible cable to slide between stops while maintaining a reliable electrical connection.

It is a further object of this invention to provide a sliding connector block mechanism in which the flexible cable is protected from bend stressing, wear and other physical damage and is held in place during normal operational use.

It is a still further object of the invention to provide a sliding connector block system having a bezel for mounting a detachable antenna to the electronic device and serving as a non-conductive handle for the sliding metal tray.

These and other objectives are achieved by the present invention in which a sliding connector block system is provided to allow an electronic device to be blindly mated with a flexible cable in a highly reliable, repeatable manner and to maintain interconnection while moving in its operating environment. The major components of the sliding connector block system include a connector block, a sliding metal tray, guide rails, a bezel and a grounding clip. The connector block provides a means to securely mount a flexible cable without adhesives or fasteners and enables blind interconnection to a removable electronic device. The sliding metal tray houses the packet radio transceiver or other electronic device allowing it to slide out of a notebook computer or other device for optimal performance. The guide rails provide for alignment of the connector block and sliding metal tray and a means for grounding the electronic device to the cartridge. The bezel provides a decorative cover for the open bay area, an antenna latch, a handle for accessing the sliding metal tray/radio assembly, and a structure in which to mount the antenna and detents for a rotating antenna. The grounding clip grounds the flexible cable to the sliding metal tray and rails.

The packet radio (i.e., wireless modem) is housed in the sliding metal tray. The packet radio metal tray assembly is inserted into a removable cartridge in the laptop computer along with a Type II PC base card adapter and the flexible cable mounted in the connector block. The flexible cable is blindly connected to the radio connector at the back edge of the packet radio by sliding the packet radio metal tray assembly along the guide rails until interconnection is made. The cable is mounted in the connector block in manufacturing and routed around the back of the radio behind a post in the left rail to the front of the Type II PC base card adapter, forming S-shaped bends that provide slack to allow the tray to slide in and out through the computer bay opening without disconnecting the cable. The packet radio/tray/bezel cable assembly slides partially out of the left side of a notebook computer bay to a stop. When pulled past the stop, the packet radio/tray/bezel assembly can be pulled completely out (like a diskette), while the connector block and flexible cable remain in place at the stop. One key aspect of the invention is that the flexible cable and connector block disconnect from the packet radio/tray when the packet radio/tray is removed. The metal tray travels back and forth in the guide rails attached to the underside of the cartridge top cover. Undercuts in each rail act as stops for the connector block to limit travel while allowing the tray to be pulled with some force past stops for removal. The bezel is bonded to the front of the sliding metal tray and includes a handle for sliding the metal tray/radio assembly and a mount for the antenna. The grounding clip slides into the connector block making contact with the ground section of the flexible cable and the inside of the left rail.

BRIEF DESCRIPTION OF THE DRAWINGS

The invention will be described with respect to a preferred embodiment thereof which is further illustrated and described in the drawings.

DETAILED DESCRIPTION OF THE PREFERRED EMBODIMENT

Before describing the invention in detail, it is important to have a clear understanding of the constraints and limitations that had to be met by the sliding connector block system.

The following are key constraints that had to be met by the present invention:

1. No modifications were allowed to the notebook computer, packet radio, radio connector, cartridge or flexible cable.

The packet radio (10.5 mm–12 mm high by 54 mm wide) and tray had to fit through and slide under a rib in a 15 mm high computer bay opening without binding, leaving only a 1.5 mm clearance between the front of the radio and the computer and little clearance on either side of the radio.

2. The design was required to be durable, robust, aesthetic, light weight and not subject to breakage.

3. A 130 mm long, rotating, flat, blade style antenna had to be reliably attached to the existing 5 mm high microminiature, board-mounted electrical connector, and isolated from mechanical stresses/forces to ensure the integrity of the connection.

4. No holes were allowed in the packet radio to snap-in or attach the bezel. Holes would be an electromagnetic compatibility (EMC) concern, as well as a marketing concern to original equipment manufacturers (OEMs). Adhesives could not be used because they might not be durable in all operating environments.

5. The antenna connector had to be compatible with both the flexible antenna on one side, and the existing, non-industry, standard radio connector on the other side.
6. The packet radio/tray assembly had to slide in and out through the computer option bay opening.
7. Tray material and rails had to be made from conductive metal.
8. There had to be a solid stop at each end of the tray's travel without damaging or breaking the fragile flexible cable.
9. The tray had to be grounded to the cartridge, rails had to be grounded to the cartridge and tray, and the flexible cable had to be grounded to the packet radio, tray, rails and cartridge.
10. The complete assembly with the packet radio had to meet EMC, FCC testing, and all hardware safety and testing requirements.
11. The metal tray had to slide freely, but lock vertically and horizontally into position.
12. Since commercially available antenna, hardware, and guide rails were not available, a custom antenna was required, as well as custom rails and tray.
13. The packet radio did not conform to industry standard PC card dimensions/criteria, and its dimensions varied among manufacturing batches. Electromagnetic compatibility restrictions prohibited adding slots or holes in the radio cover. Dimensional restrictions prohibited vertically or horizontally adding attachment devices.

Figure 2A:
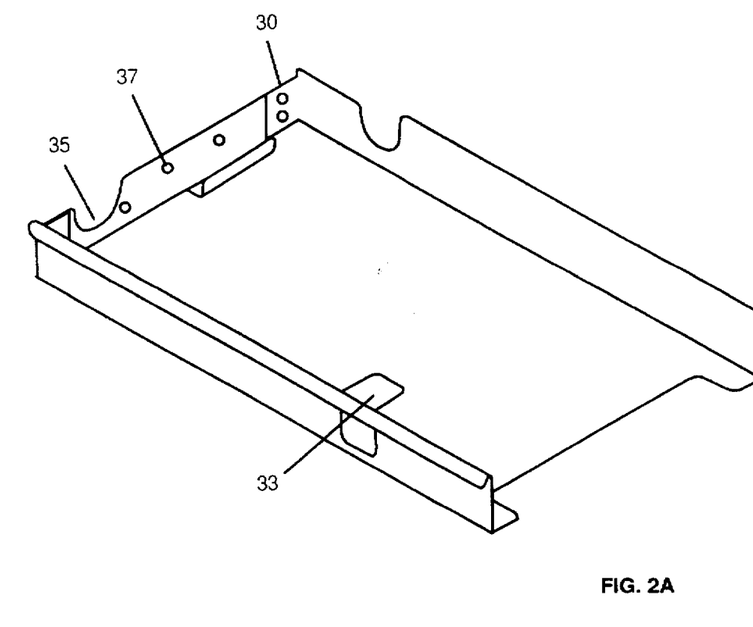
FIG. 2A shows a top isometric view of the metal tray used in the present invention.
Figure 2B:
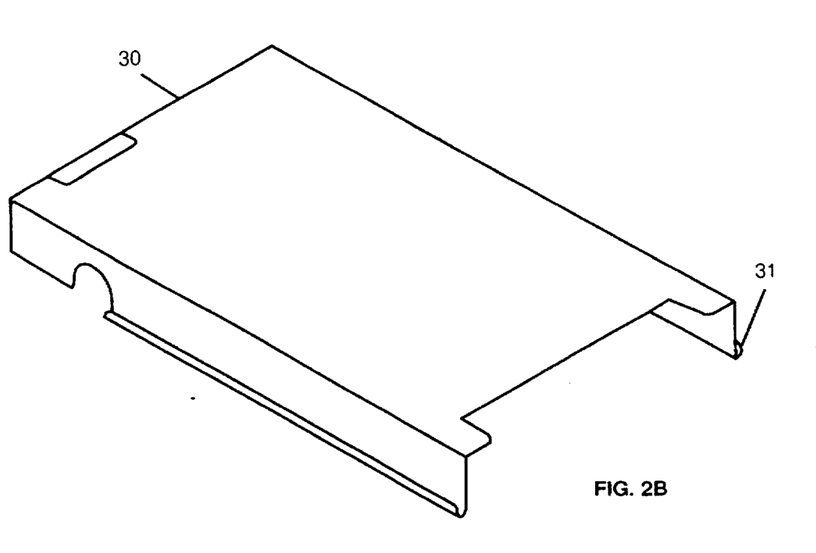
FIG. 2B shows a bottom isometric view of the metal tray used in the present invention.

FIGS. 2A–2B show top and bottom isometric views, respectively, of the metal tray used in the sliding connector block system. The packet radio is positioned in the metal tray below the horizontal tab 33.

Figure 3:
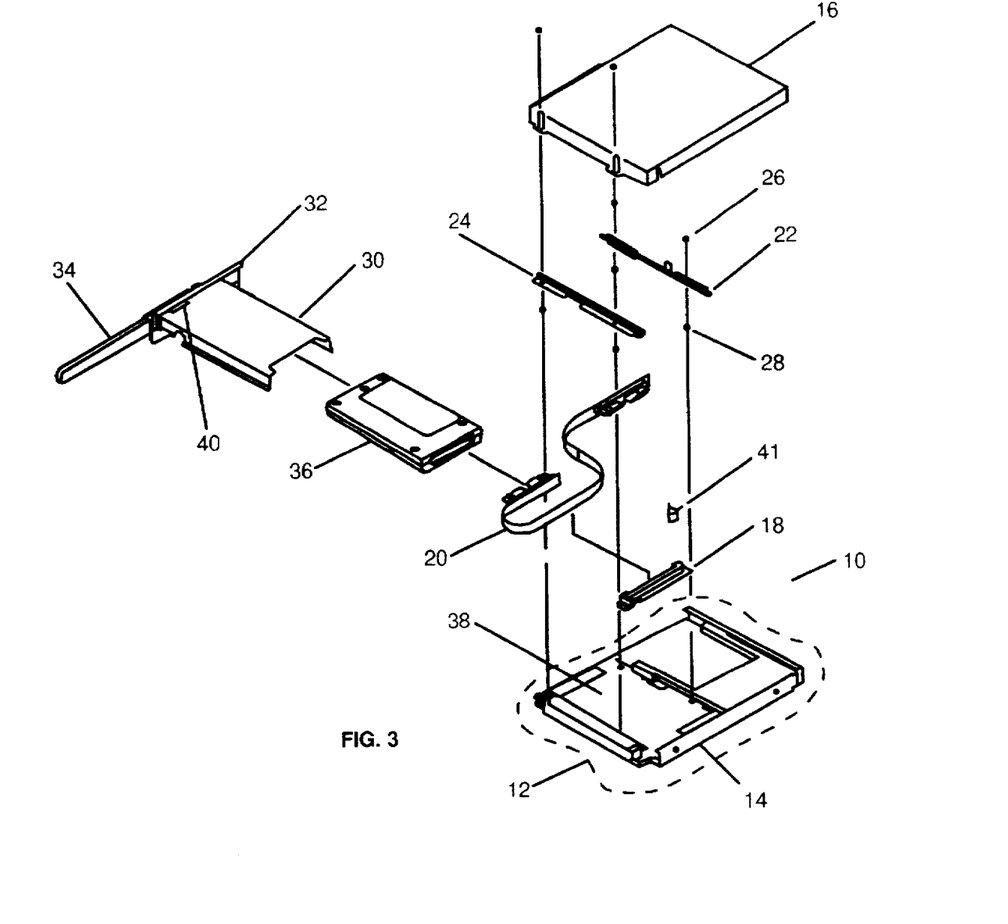
FIG. 3 shows an exploded isometric view of the sliding connector system components of the present invention.

FIG. 3 shows an isometric view of the sliding connector block system 10 as used in a wireless modem device including the connector block 18; rails 22, 24; sliding metal tray 30; bezel 32; and grounding clip 41. Also illustrated in FIG. 3 are packet radio 36, blade antenna 34, antenna clip 40 and flexible cable 20. The custom blade antenna 34 and antenna clip 40 shown can be obtained from Centurion International; the flexible cable 20 can be obtained from ITT Cannon.

Figure 4:
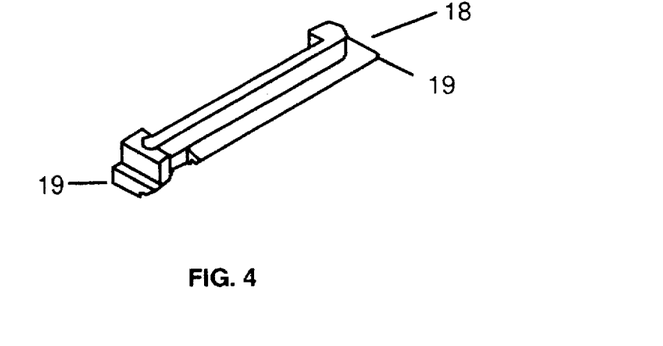
FIG. 4 shows an isometric view of the connector block component of the present invention.

FIG. 4 shows an isometric view of the connector block 18. The prototype connector blocks were machined from black Delrin (TM), a DuPont acetal plastic because of its availability, machinability, and good sliding properties, specifically low friction resistance. Production parts are molded using black acetal or General Electric plastic PBT valox to provide a smooth, sliding surface, good molding properties and dimensional stability. Connector block surfaces have to be smooth and level to allow the connector block 18 to slide freely.

Figure 10A:
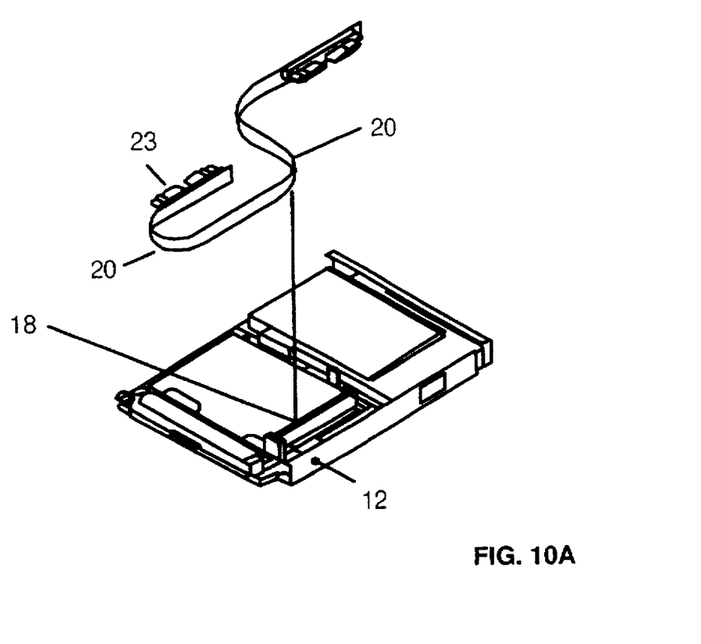
FIG. 10A shows an exploded isometric view showing the positioning of the flexible cable in the connector block in the preferred embodiment of the invention.
Figure 10B:
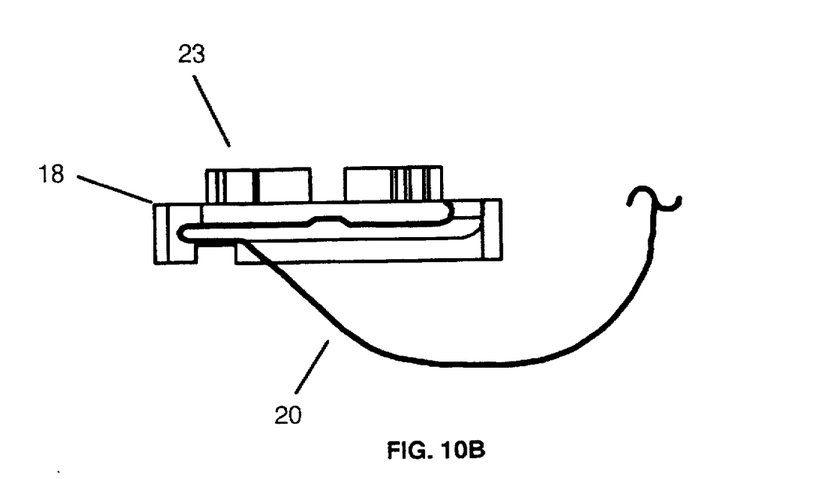
FIG. 10B shows a top view of the connector block of the present invention with the flexible cable locked into position.

The flexible cable connector 20 is mounted in the connector block 18 as shown in FIG. 3 and in FIGS. 10A–10B. The copper ground area of the flexible cable connector slides down into the right side of the connector block as shown. The left side of the flexible cable is inserted within the slotted bend.

The flexible cable 20 has to be installed before the grounding clip 41 is installed. The grounding clip 41 slides down into the flexible connector block grounding area and the connector block 18 where shown. The grounding clip 41 should not extend above the connector block 18. The long end of the grounding clip 41 must be positioned adjacent to the back end of the left rail 22 to ensure that it makes contact with the sliding tray 30.

The connector block 18 is positioned within undercuts in the right and left rails (24, 22). Flanges 19 on the left and right side of the connector block 18 align the connector block 18 under the rails (22, 24) both horizontally and vertically to establish a reliable, repeatable connection between an electronic device connector and a flexible cable connector. Inserting and removing the electronic device 36 causes the connector block 18 to move backward or forward between the rear wall of the cartridge and front stops in the rails (22, 24), offering support to align the electronic device 36 for connection to the flexible cable connector 23 mounted in the connector block 18. Connection is made when the connector block 18 is moved all the way back to the rear stop in the cartridge to connect with the inserted electronic device 36. Connection is lost when the interconnected electronic device 36 and block move forward to a front stop in the rails, and the electronic device 36 is pulled forward past the stops for removal. The combination of moving, blind interconnection is thus possible between electronic device 36 and the flexible cable 20.

The flexible cable 20 slides down into the connector block 18. The flexible cable connector is aligned at the radio end, and slides down until the connector snaps into place, routing the flexible cable 20 inside the slot around the bend at the right. The horizontal slot cut across the block and a semi-circular slot at the right side form a cavity in which the flexible cable connector 23 and flexible cable 20 fit. Two raised semi-spherical dots (R0.75 mm) lock over the top of the flexible cable 20 to secure it in place so that it cannot ride up, but can be removed with a small amount of force. The flexible cable 20 is routed inside the semi-circular slot, then behind the connector block 18, and forward over the left rail 22, behind an alignment post 19 in the left rail 22 to connect with another PC card or similar device. The flexible cable 20 is positioned on top of an extended, projecting surface of the connector block to protect the flexible cable 20 from being pinched or damaged when the connector block 18 is moved all the way back to a stop.

The sliding, metal tray 30 of the present invention as shown in FIGS. 2A–2B is fabricated from AISI 304, ¼ hardness temper, stainless steel (0.3 millimeter thick). Tabs folding inside the tray front are spot welded to the front of the tray. The tray front has a semi-circular cutout 35 to provide clearance for the radio connector and seven round holes 37 that mate with posts on the plastic bezel 32.

A tab 33 folds up from the base of the tray to align the packet radio 36 in the tray 30, to provide space for the connector, and to keep the packet radio 36 from sliding forward past a stop.

Figure 5:
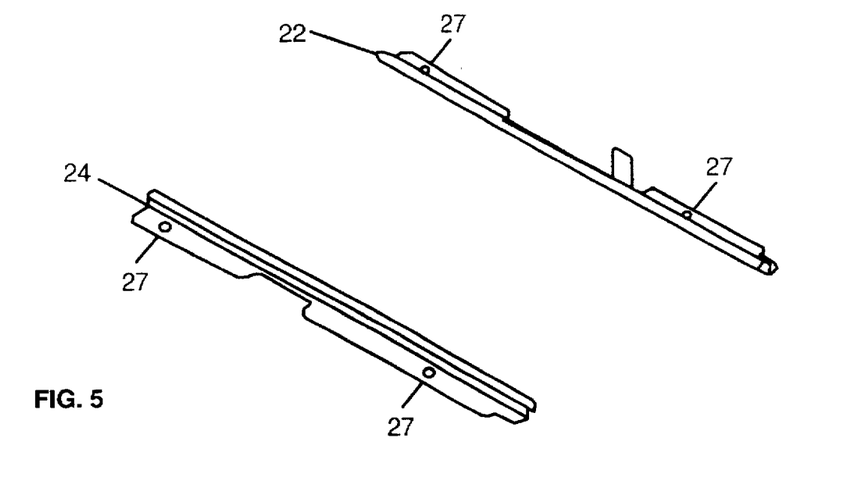
FIG. 5 shows isometric views of the left and right rails of the present invention.

The U-shaped tray flanges 31 interlock with and align within the U-shaped guide rails (22, 24) and slide into the guide rails (22, 24) (like a diskette). FIG. 5 shows an isometric view of the left 22 and right 24 guide rails. The guide rails are fabricated from 0.3 millimeter thick stainless steel having a ¼ hardness temper. To provide a smooth, sliding surface, all surfaces must be free of burrs and sharp edges. The guide rails (22, 24) each have a flat, mounting flange 29 containing two, round mounting holes 27 for screws. The rails (22, 24) have an undercut at the back of the rails (22, 24) that limits the travel of the connector block 18 while letting the tray 30 slide freely the full distance from front to back.

Stainless steel mounting screws are inserted up through the circuit card, through the mounting holes 27 in the rails (22, 24) and are fastened with hex nuts 26.

The U-shaped rails (22, 24) and U-shaped tray flanges 31 interlock to reduce sideplay. The left rail 22 includes a vertical post that aligns the flexible cable 20 behind the rail 22.

Figure 6:
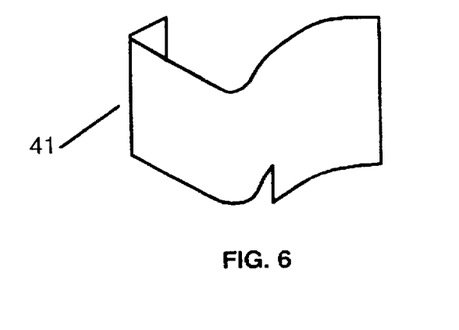
FIG. 6 shows an isometric view of the grounding clip of the present invention.

FIG. 6 shows the detachable spring steel grounding clip 41. The grounding clip 41 slides into the connector block 18, making contact with the ground section of the flexible cable 20. When the tray 30 slides, the grounding clip 41 is pressed between the side of the tray 30 and the left rail 22. Grounding clip 41 surfaces must be smooth, free of burrs and sharp edges to ensure smooth sliding. A preferred material for grounding clip 41 is beryllium copper because of its resilience.

Figures 7A, 7B:
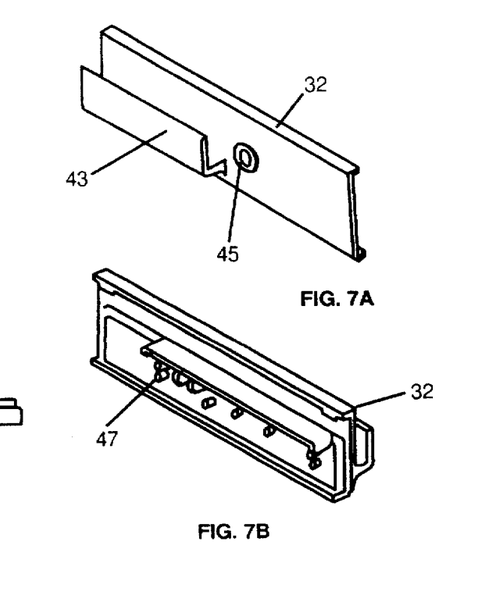
FIG. 7A shows a front isometric view of the bezel of the present invention.
FIG. 7B shows a rear isometric view of the bezel of the present invention.

The bezel 32 shown in FIGS. 7A-7B is molded from non-conductive, PC/ABS or ABS plastic to provide a decorative cover for the open bay area, an antenna latch, a handle 43 for accessing the sliding metal tray 30/radio 36 assembly, and a structure in which to mount the antenna 34. Detents for antenna rotation stops are built into the flanges of bezel 32, spring locking antenna clip 40 (illustrated in FIG. 8) and antenna connector.

A small raised indicator on the front surface of the bezel 32 denotes the antenna removal position. The antenna 34 (FIG. 8) is locked and cannot be detached in any other position.

The bezel 32 is permanently bonded to the front of the sliding, metal tray 30 with epoxy for strength, so that the bezel 32 fits flush with the front of tray 30. Seven heat stake posts 47 on bezel 32 are aligned with seven round holes 37 in the front of tray 30. The posts 47 are then heat staked to securely fasten the tray 30 and bezel 32.

The bezel 32 provides mechanical support for the connector interface between the radio 36 and antenna 34, providing protection and mechanical stress/strain relief to minimize the load on the radio connector solder joint. An oval area is hollowed out of the bottom of the antenna latch on bezel 32 to make the handle easier to grip and pull out.

Figure 8:
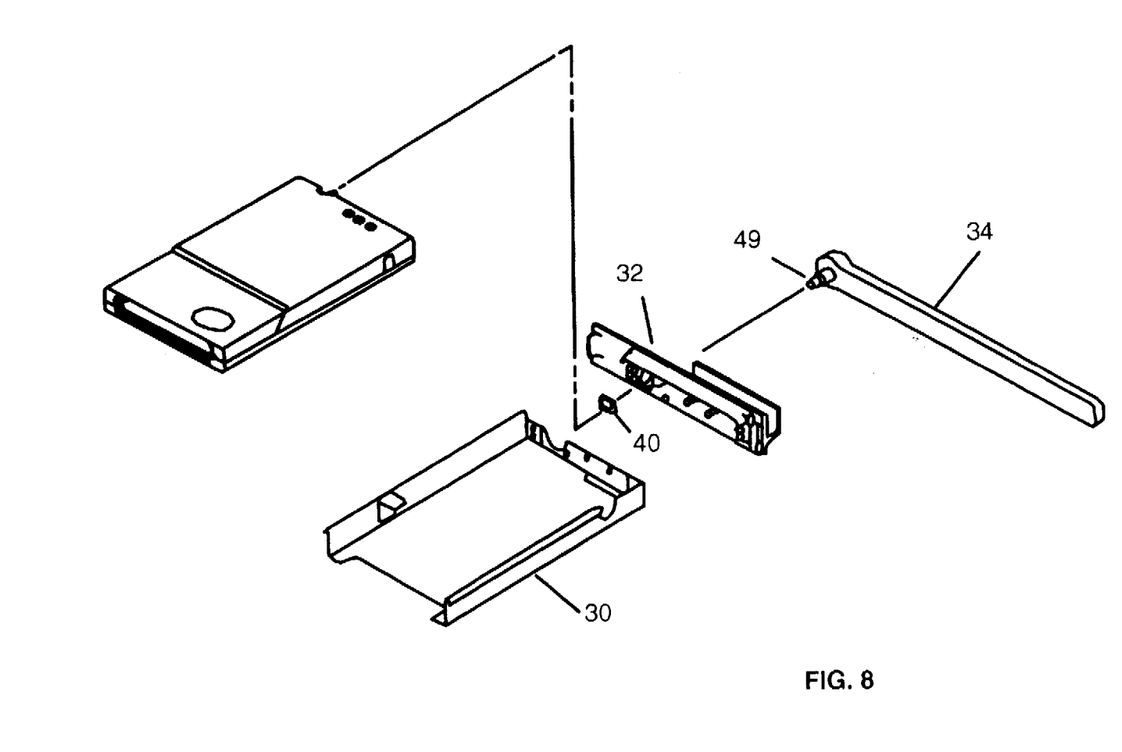
FIG. 8 shows an exploded isometric view of the antenna/bezel/radio/tray assembly of the present invention.
Figure 11:
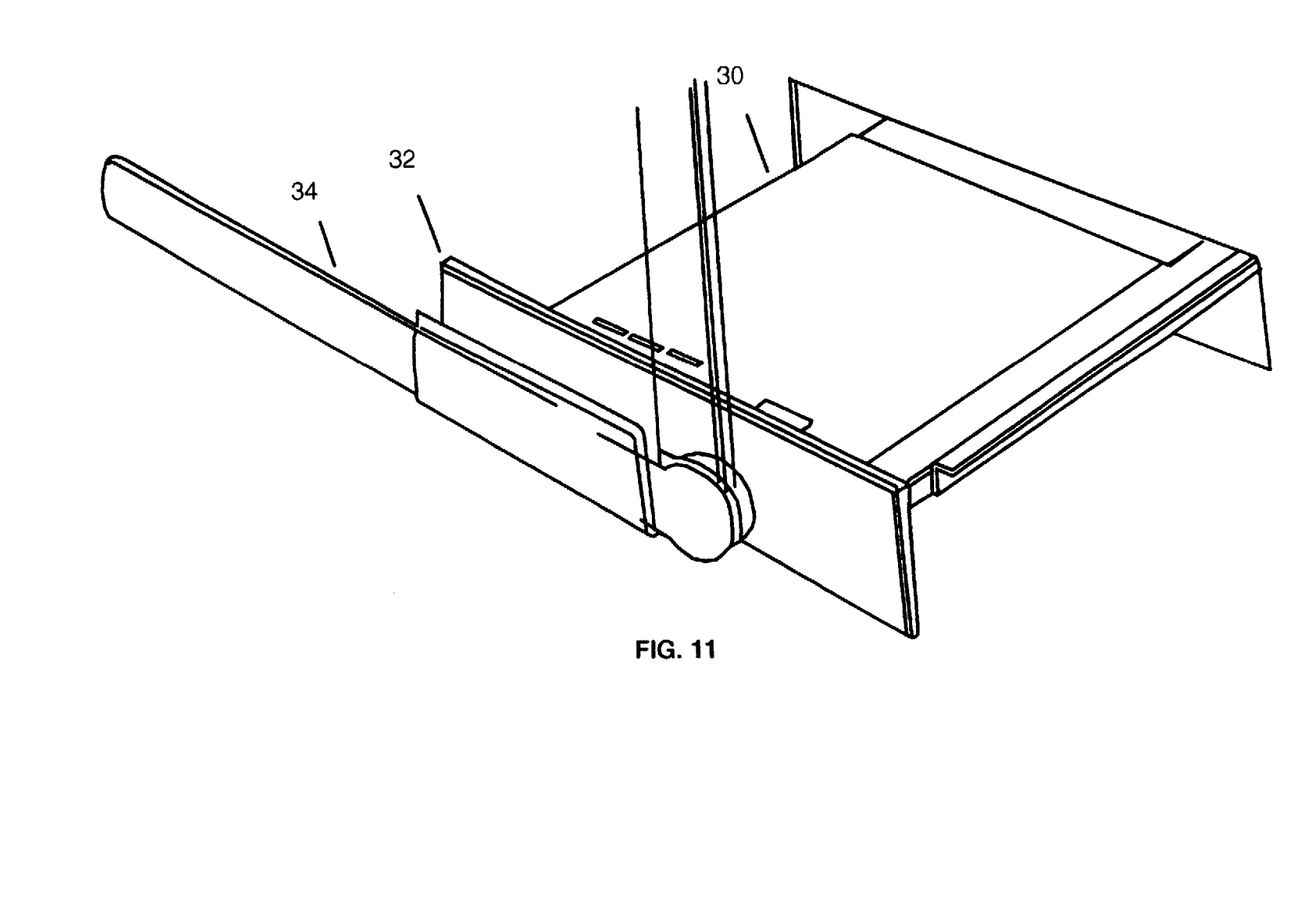
FIG. 11 shows an isometric view of the antenna/bezel/tray assembly of the present invention.

FIG. 8 shows the detachable, rotating flat blade style antenna 34 used in the present invention. The antenna connector 49 allows the uniplanar antenna to rotate 360 degrees in a plane parallel to the left side of the notebook computer, while providing detents for positive stopping every 45 degrees. The antenna 34 consists of a flexible, molded straight whip section attached to a rigid, right-angle, molded cap housing an RF coaxial connector and internal printed circuit board. The antenna connector flat surfaces provides detents for positive locking every 90 degrees when the antenna is rotated 180 degrees within a metal clip 40 adjoining the radio connector. The electrical design of antenna 34 consists of an end-fed, half wave antenna system that is fed by an impedance matching network. The antenna 34 used in the present invention is available from Centurion International. FIG. 11 provides an isometric view of the antenna/bezel/tray assembly of the present invention.

The right-angle antenna connector 49 rotates directly on the board-mounted, right angle radio connector. The antenna connector 49 is inserted through a hole 45 in the bezel to mate with the radio connector.

A detachable, annealed, mill heat-treated, beryllium copper antenna locking spring clip 40 provides a spring to lock the antenna in place between flanges on the back of the bezel 32 and provide detents. The clip 40 snaps over the bezel flanges before the antenna 34 is installed and remains on the bezel flanges.

Figure 9:
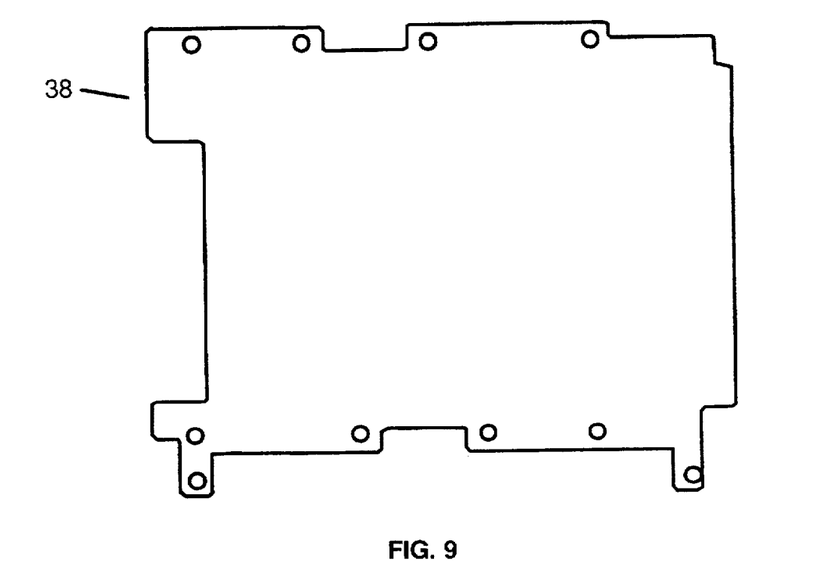
FIG. 9 shows a top view of the insulating tape attached to a surface of a printed circuit card that provides a sliding plane for the connector block of the present invention.

FIG. 9 shows the insulating tape 38 that provides a sliding plane for the connector block 18, and protects the electrical circuits on the circuit card, over which the tray 30 and block 18 slide. The prior art polyvinylchloride insulating tape and black insulating tapes were replaced with the single-piece sheet of polyvinylchloride 38 reshaped and expanded to extend from front to back to cover the electric circuits and sliding plane and prevent the connector block 18 from catching and binding.

FIG. 10A shows the removable, flexible cable 20 used with the present invention. The flexible cable connector 23 (radio end) is inserted within the cutout slots in the connector block 18. The cable is routed to the right, then back around to the left, and forward and right, in an S-shape to join the Type II PC card adapter (baseband card) with the packet radio device. This routing allows the flexible cable 20 to move backward and forward with the sliding radio 36/tray 30 assembly.

A bottom cover 16 was added to make the cartridge 12 more modular, protect the electronics, and give the cartridge 12 a more finished appearance.

Figure 12A:
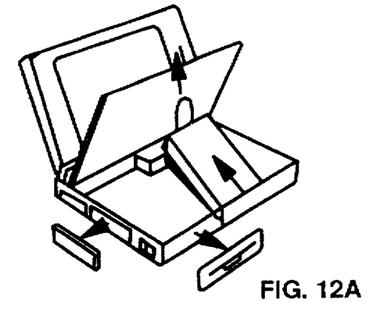
FIGS. 12A–12F show the application of the present invention to a wireless modem device installed in a portable computer system.
Figure 12B:
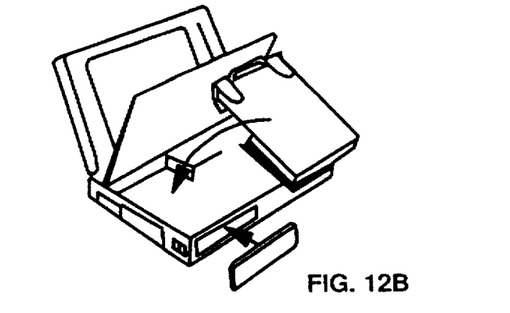
Figure 12C:
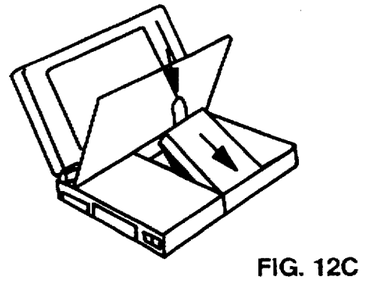
Figure 12D:
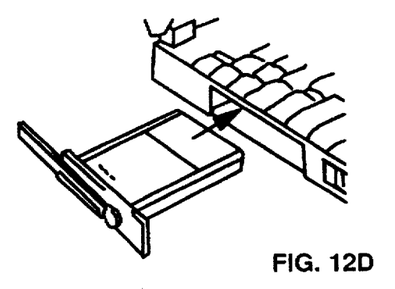
Figure 12E:
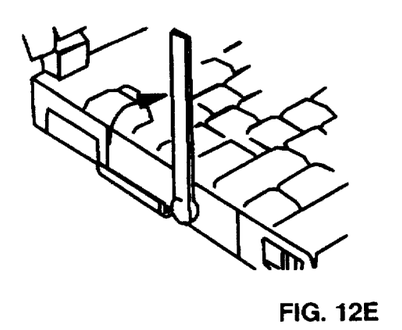
Figure 12F:
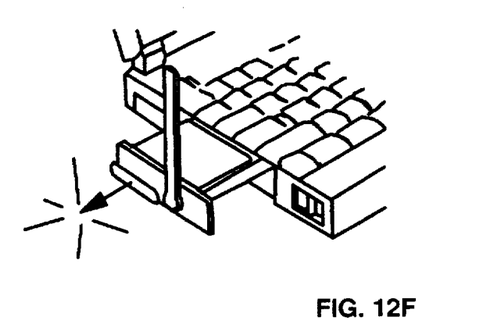

FIGS. 12A-12F illustrate the application of the sliding block connector system described herein to a wireless modem device that can be installed in a portable, laptop computer such as the IBM Thinkpad portable computers. FIG. 12A shows the raising of the laptop keyboard to access bay areas where peripheral devices can be installed. The wireless modem cartridge is installed in the bay area to the far left. The sliding antenna/bezel/radio/tray assembly is then inserted through a PCMCIA adapter slot as shown in FIG. 12D. The assembly is shown fully inserted in FIG. 12E and partially removed in FIG. 12F as would occur in normal operational use.

In an alternative embodiment, a dipole antenna and sliding, RF coaxial connection system are integrated into the top cover of a notebook computer to optimize electrical performance, electromagnetic compatibility and ergonomics and provide the most 3, omnidirectional coverage possible when the top cover is raised to use the notebook computer.

This alternative embodiment includes the following major components:

1. Dipole antenna;
2. Sliding, retractable radio frequency (RF) coaxial connection system;
3. Radio frequency (RF) coaxial connection system routed through the cover hinges via connectors or flat cables to the notebook base;
4. Packet radio, PC card, chip or other electronic device.

A second alternate embodiment includes a PC card with an external, articulating dipole antenna system. This second alternate embodiment includes the following major components:

1. Permanently attached (i.e., non-detachable) articulating, dipole antenna that can move 360 degrees in any plane for optimized electrical performance;
2. Packet radio, PC card, chip or other electronic device Type I, II or III PC card radio having industry standard construction, tolerances, materials and dimensions, allowing the use of commercially available cover sets, rails, and hardware;
3. Audio: Microphone and speakers incorporated into the chip, radio, software or notebook eliminating the need for a headset jack or earpiece with wire;
4. Restricted opening and reduced size of the bay so that alignment rails are not needed—the radio would be self-aligning within the restricted opening;
5. Industry standard connectors and components;
6. Bezel locking feature to lock the bezel in place: Position antenna straight up in use position to unlock and pull out tray assembly; flip antenna down in the storage position (e.g., 9:45 on a clock) to lock tray assembly in place to keep it from falling out of notebook or other device when carried or not in use;

7. Clip on the left end of the bezel to protect the antenna;

8. Single piece construction (radio, antenna, bezel are all in one unit).

While the invention has been particularly shown and described with reference to the particular embodiments thereof, it will be understood by those skilled in the art that various changes in form and details may be made therein without departing from the spirit and scope of the invention.

Having thus described our invention, what we claim and desire to secure as Letters Patent is as follows:

1. A sliding connector block apparatus for inserting an electronic device into a compartment of an electrical equipment enclosure, electrically interconnecting the electronic device via a flexible cable having cable connectors disposed at each end to an electrical component installed in the enclosure, and moving said electronic device to adjust its performance, said compartment having a pair of side walls, a rear wall, a top cover, a bottom cover and an opening for inserting said electronic device, comprising:

- a metal tray for housing said electronic device, said metal tray having a front surface, a base surface and a pair of side surfaces with curved flanges at the upper end of said side surfaces and extending substantially along the length of the upper edge of the side surfaces;
- a pair of curved guide rails disposed laterally along the upper edge of the side walls forming the interior portion of said compartment for inserting said curved flanges of said metal tray enabling said metal tray to be inserted into and removed from said enclosure, said guide rails having a flat flange portion for mounting said guide rails within said enclosure;
- a sliding connector block disposed adjacent to the back wall of the compartment and having slots for inserting and for securing the cable connector disposed at one end of the flexible cable to enable blind electrical interconnection with a connector on the electronic device, said sliding connector block further including a top surface with a pair of vertical flanges disposed at each end to enable the sliding connector block to travel within said pair of guide rails to adjust the performance of said electronic device while maintaining electrical interconnection.

2. The sliding connector block apparatus of claim 1 further comprising a bezel mounted on the front end of said metal tray and including a handle for inserting said metal tray into said compartment.

3. The sliding connector block apparatus of claim 2 wherein said bezel further includes an opening to enable an antenna to be mounted to a coaxial connector on said electronic device.

4. The sliding connector block apparatus of claim 3 wherein said antenna is a detachable, rotating flat blade.

5. The sliding connector block apparatus of claim 4 wherein said antenna is an end-fed half wave antenna.

6. The sliding connector block apparatus of claim 3 wherein said bezel handle provides snap down protection for said antenna when said antenna is not in operational use.

7. The sliding connector block apparatus of claim 2 wherein said bezel is molded from non-conductive plastic.

8. The sliding connector block apparatus of claim 7 wherein said bezel is permanently bonded to the front of the metal tray by heat staking posts on the bezel that are aligned with holes positioned in the front of said metal tray.

9. The sliding connector block apparatus of claim 1 further comprising a grounding clip that is inserted into the sliding connector block and makes contact with a ground section of the cable connector secured in said sliding connector block.

10. The sliding connector block apparatus of claim 9 wherein one end of said grounding clip is positioned adjacent to an end of the left rail to make contact with the sliding tray.

11. The sliding connector block apparatus of claim 10 wherein said grounding clip is fabricated from a beryllium copper alloy.

12. The sliding connector block apparatus of claim 1 wherein said metal tray is fabricated from a single sheet of ¼ hardness temper stainless steel.

13. The sliding connector block apparatus of claim 1 wherein said pair of guide rails have an undercut portion at the back end of the rails to limit travel of said sliding connector block and provide a physical stop for sliding movement of the metal tray requiring that an additional force be applied to the tray to break the electrical interconnection and remove the tray from the enclosure.

14. The sliding connector block apparatus of claim 1 wherein said sliding connector block is fabricated from an acetal plastic material.

15. The sliding connector block apparatus of claim 1 wherein said flat flange portion of said pair of guide rails is mounted to a printed circuit card disposed below the top cover of the enclosure by inserting fasteners through holes in the flat flange portion that align with holes on the edges of the lateral surface of the printed circuit card.

16. The sliding connector block apparatus of claim 15 further including a polyvinylchloride insulating tape that is attached to a lower lateral surface of said printed circuit card to provide a sliding plane for the sliding connector block as it travels within the pair of guide rails.

17. The sliding connector block apparatus of claim 1 wherein said electronic device is a transceiver part of a wireless modem.

18. The sliding connector block apparatus of claim 17 wherein said electrical component installed in the enclosure is a baseband portion of the wireless modem.

19. The sliding connector block apparatus of claim 18 wherein said cable connector disposed at a second end of said flexible cable is connected to the baseband portion of the wireless modem.

20. The sliding connector block apparatus of claim 1 wherein said electrical equipment enclosure is a PC card cartridge.

21. The sliding connector block apparatus of claim 1 wherein said electrical equipment enclosure is installed in, and electrically interconnected to a portable computing device.

* * * * *